(12) United States Patent
Wang et al.

(10) Patent No.: US 8,415,222 B2
(45) Date of Patent: Apr. 9, 2013

(54) SEMICONDUCTOR DEVICE AND METHOD FOR MANUFACTURING THE SAME

(75) Inventors: Wenwu Wang, Beijing (CN); Xueli Ma, Beijing (CN); Wen Ou, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/061,655

(22) PCT Filed: Sep. 28, 2010

(86) PCT No.: PCT/CN2010/077386
§ 371 (c)(1),
(2), (4) Date: Mar. 1, 2011

(87) PCT Pub. No.: WO2011/124061
PCT Pub. Date: Oct. 13, 2011

(65) Prior Publication Data
US 2012/0021584 A1    Jan. 26, 2012

(30) Foreign Application Priority Data
Apr. 9, 2010   (CN) .......................... 2010 1 0145587

(51) Int. Cl.
*H01L 21/336*    (2006.01)
(52) U.S. Cl. .. 438/301; 438/576; 438/585; 257/E21.409

(58) Field of Classification Search ............... 438/301, 438/576, 585
See application file for complete search history.

(56) References Cited

U.S. PATENT DOCUMENTS

| | | | |
|---|---|---|---|
| 7,879,675 B2* | 2/2011 | Radosavljevic et al. | 438/268 |
| 2010/0193771 A1* | 8/2010 | Majhi et al. | 257/24 |
| 2010/0200912 A1* | 8/2010 | Hsieh | 257/329 |

* cited by examiner

*Primary Examiner* — Alexander Ghyka
(74) *Attorney, Agent, or Firm* — Troutman Sanders LLP (57) ABSTRACT

The present invention provides a semiconductor device and a method for manufacturing the same. The method includes: providing a substrate; forming a gate stack on the substrate; forming an inter layer dielectric (ILD) to cover the device; etching the ILD at both sides of the gate stack and the substrate below the ILD, so as to form a groove of source and drain regions respectively; depositing a metal diffusion barrier layer in the groove; and filling the groove with a metal to form the source and drain regions. The semiconductor device includes: a substrate; a gate stack on the substrate; an inter layer dielectric (ILD) covering the device; a groove of source and drain regions formed in the ILD at both sides of the gate stack and the substrate below the ILD; and a metal diffusion barrier layer and a metal filler formed in the groove. According to the present invention, the S/D parasitic resistance in the MOS device is reduced, the S/D stress on the channel is increased, the process temperature is lowered, and the process compatibility between the high k gate dielectric layer and the metal gate is improved.

6 Claims, 11 Drawing Sheets

SEMICONDUCTOR DEVICE AND METHOD FOR MANUFACTURING THE SAME

BENEFIT CLAIMS

This application is a US National Stage of International Application No. PCT/CN2010/077386, filed Sep. 28, 2010, which claims the benefit of CN 201010145587.7, filed Apr. 9, 2010.

FIELD OF THE INVENTION

The present invention generally relates to methods for manufacturing semiconductor devices and structures thereof, and particularly, to a semiconductor device combining technologies of embedded metal source/drain (S/D) and low schottky barrier S/D and a method for manufacturing the same.

BACKGROUND OF THE INVENTION

Currently, researches on the S/D engineering include the ultra shallow low resistance PN junction S/D technology, the low schottky barrier metal S/D technology, the elevated S/D technology, etc.

The ultra shallow low resistance PN junction S/D technology has a very high processing requirement. It requires a low energy ion implantation to implement the ultra shallow low resistance S/D, and bears a high temperature annealing of about 1000° C. to activate the doped ions. The annealing process under a high temperature not only affects reliabilities of the high k gate dielectric layer and the metal gate, but also easily causes problems such as source and drain breakthrough due to ion diffusion.

On the other hand, for the low schottky barrier metal S/D technology, it is also a great challenge to decrease the schottky barrier height while reducing the S/D resistance. Currently, the common method is to deposit a metal layer (e.g., Ni and NiPt alloy) on a semiconductor substrate at the S/D, and through an annealing process, make the metal layer react with the semiconductor substrate to generate a metal silicide (e.g., NiSi, NiPtSi, etc.). On this basis, the schottky barrier is controlled by way of ion implantation and impurity segregation methods. The methods requires refined process conditions, which proposes high requirements of parameters such as thickness, annealing time and temperature of the deposited metal, and the diffusion control of the metal in the channel direction. In addition, reduction of the S/D parasitic resistance in the low schottky barrier S/D technology is also a challenge urgently to be solved.

For the elevated S/D technology, main process is to firstly form a gate structure on the semiconductor substrate, then perform a light doped ion implantation on the semiconductor substrate at the S/D, and form an insulation layer sidewall at both sides of the gate. Based on this structure, an elevated S/D layer (e.g., GeSi, SiC, etc.) is formed on the S/D by way of an epitaxial growth. Another preparing method of the elevated S/D process is to embeddedly introduce semiconductor silicide or carbide (e.g., GeSi, SiC, etc.) by way of an epitaxial growth in the S/D region during a gate last process. Although the above elevated S/D technology in a certain extent reduces the S/D resistance and increases the stress, the device structure and the preparing process still need to be optimized due to problems such as the inherent doping density limitation and the contact resistance, so as to further reduce the S/D parasitic resistance and optimize the mobility caused by the device structure and the process.

SUMMARY OF THE INVENTION

In view of the above problem, the present invention provides a MOS transistor structure combining technologies of embedded metal S/D and low schottky barrier and a method for manufacturing the same. The method comprising: providing a substrate; forming a gate stack on the substrate; forming an inter layer dielectric (ILD) to cover the device; etching the ILD at both sides of the gate stack and the substrate below the ILD, so as to form a groove of source and drain regions respectively; depositing a metal diffusion barrier layer in the groove; and filling the groove with a metal to form the source and drain regions. In addition, the present invention also provides a semiconductor device, comprising: a substrate; a gate stack on the substrate; an inter layer dielectric (ILD) covering the device; a groove of source and drain regions formed in the ILD at both sides of the gate stack and the substrate below the ILD; and a metal diffusion barrier layer and a metal filler formed in the groove.

In the present invention, the source and drain regions on the semiconductor substrate are etched and metal filled to implement replacement of the conventional PN junction S/D with the embedded metal S/D. Through the present invention, the S/D parasitic resistance in the MOS device is reduced, the S/D stress on the channel is increased, the process temperature is lowered, and the process compatibility between the high k gate dielectric layer and the metal gate is improved.

DETAILED DESCRIPTION OF THE EMBODIMENTS

The following disclosure provides several different embodiments or examples to implement different structures of the present invention. In order to simplify the disclosure of the present invention, the components and arrangements of specific examples are described in the following text. Of course, they are just exemplary, and do not intend to limit the present invention. In addition, reference numbers and/or letters can be repeatedly used in different examples of the present invention for the purposes of simplification and clearness, without indicating the relationships between the discussed embodiments and/or arrangements. Further, the present invention provides examples of various specific processes and materials, but a person skilled in the art can realize availability of other processes and/or usage of other materials. Moreover, a structure described as follows in which a first feature is "on" a second feature, may include an embodiment where the first and second features are formed to directly contact with each other, or an embodiment where another feature is formed between the first and second features so that the first and second features may not directly contact with each other. To be noted, the components as illustrated in the drawings are not always drafted to scale. The present invention omits the descriptions of the well-known assemblies as well as the treating technologies and processes to avoid unnecessary limitations to the present invention.

First Embodiment

Figure 1:
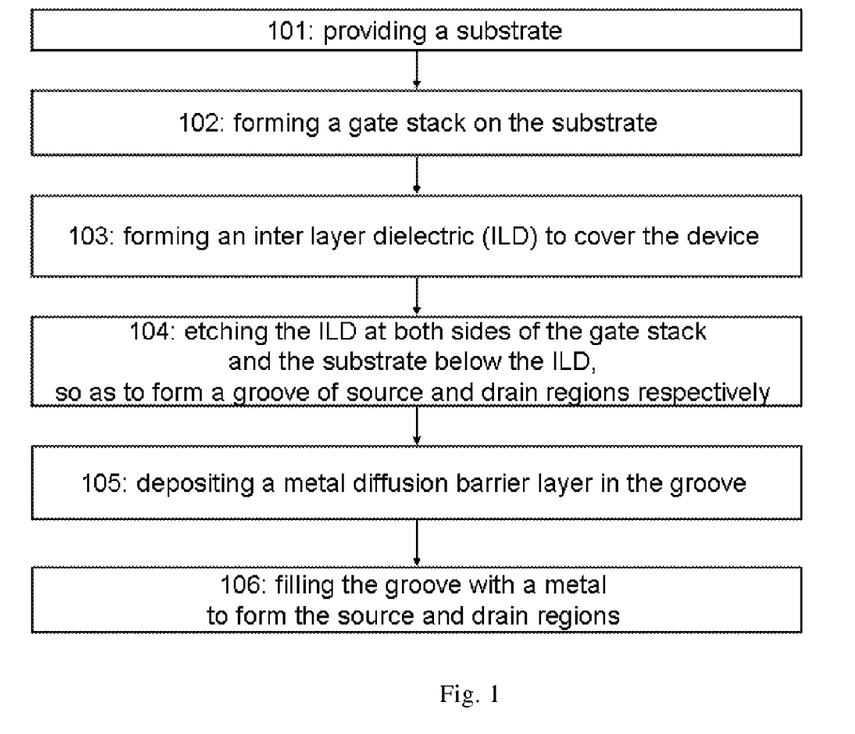
FIG. 1 illustrates a flowchart of a method for manufacturing a semiconductor device according to an embodiment of the present invention.

Referring to FIG. 1, FIG. 1 illustrates a flowchart of a method for manufacturing a semiconductor device according to an embodiment of the present invention. In step 101, a substrate 202 is firstly provided. The substrate may be a semiconductor substrate 202 having undergone an earlier stage shallow trench isolation treatment and a clarity process treatment, referring to FIG. 2. In this embodiment, the substrate 202 includes a silicon substrate in a crystal structure. As known in the art, the substrate may include various doping arrangements (e.g., P-type substrate or N-type substrate) according to design requirements. In other examples, the substrate may include semiconductors of other elements, such as germanium and diamond, or a compound semiconductor, such as SiC, GaAs, InAs or InP. Further, in order to improve performance, the substrate may optionally include an epitaxial layer and/or a silicon-on-insulator (SOI) structure. Still further, the substrate may include various features formed thereon, including an active region, source and drain regions in the active region, an isolation region (e.g., shallow trench isolation (STI) feature), and/or other features known in the art.

Figure 2:
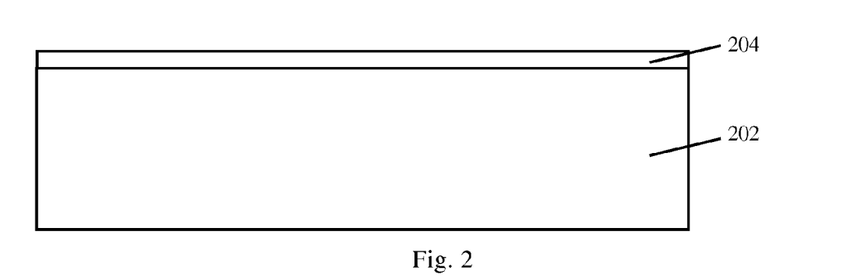
FIGS. 2-12 illustrate schematic cross-sectional diagrams at different phases of a semiconductor device according to a preferred embodiment of the present invention.

Next in step 102, a gate stack is formed on the substrate 202. The gate stack may have different layers and there are different methods for forming it. In this embodiment, the gate stack may include an interface layer 204, a high k gate dielectric layer 206 and a metal gate electrode layer 208. In the next embodiment, the gate stack may have different structures, and the detail will be described later. As illustrated in FIG. 2, the interface layer 204 may be directly formed on the substrate 202. In this embodiment, the interface layer 204 may be made of $SiO_2$, SiON or $HfSiO_x$. A thickness of the interface layer 204 is in a range from about 0.3 nm to about 2 nm. The interface layer 204 may be formed through atomic layer deposition (ALD), chemical vapor deposition (CVD), high-density plasma CVD, sputtering or other appropriate methods. The above description is just exemplary, and the present invention is not limited thereto.

Figure 3:
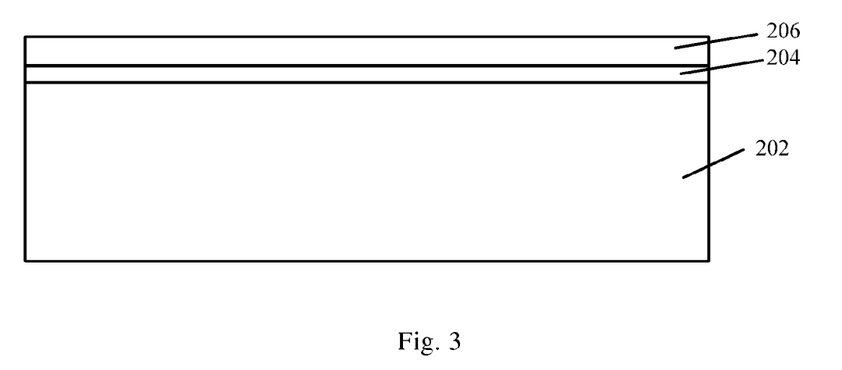

Next, the high k gate dielectric layer 206 is formed on the interface layer 204, as illustrated in FIG. 3. The high k gate dielectric layer 206 may be made of a material including a high k material (e.g., a material having a higher dielectric constant as compared with silicon oxide). Examples of the high k material include for example a hafnium-based material, such as $HfO_2$, $HfSiO_x$, $HfSiON_x$, $HfAlO_x$, $HfAlON_x$, $Al_2O_3$, $ZrO_2$, $ZrSiO_x$, $Ta_2O_5$, $La_2O_3$, $HfLaO_x$, $LaAlO_x$, $LaSiO_x$, $Y_2O_3$, $Gd_2O_3$ and $Sc_2O_3$, rare-earth metal oxide of any of the above materials, other rare-earth metal oxynitride, or any combination thereof. The high k gate dielectric layer may be formed through thermal oxidation, CVD or ALD. In this embodiment, a thickness of the high k gate dielectric layer 206 is in a range from about 1 nm to about 5 nm. The above description is just exemplary, and the present invention is not limited thereto.

Figure 4:
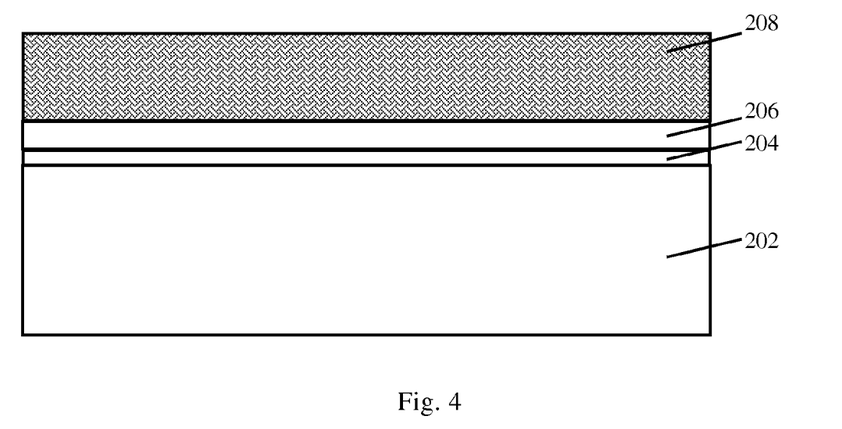

Next, as illustrated in FIG. 4, after the high k gate dielectric layer 206 is formed, the to metal gate electrode layer 208 may be deposited thereon. The metal gate electrode layer 208 may be a single-layer structure, or a multi-layer structure, with a thickness from about 5 nm to about 100 nm. A material of the metal gate electrode layer may include TaC, HfC, TiN, TaN, $MoN_x$, TiSiN, TiCN, TaAlC, TiAlN, MoAlN, $PtSi_x$, $Ni_3Si$, HfCN, TaTbN, TaErN, TaYbN, TaSiN, HfSiN, MoSiN, $RuTa_x$, $NiTa_x$, Hf $Ru_x$, $RuO_x$, Pt, Ru, Ir, Mo, Re, or any combination thereof. A structure of the metal gate electrode layer may further include a metal diffusion barrier layer. The above description is just exemplary, and the present invention is not limited thereto.

Figure 5:
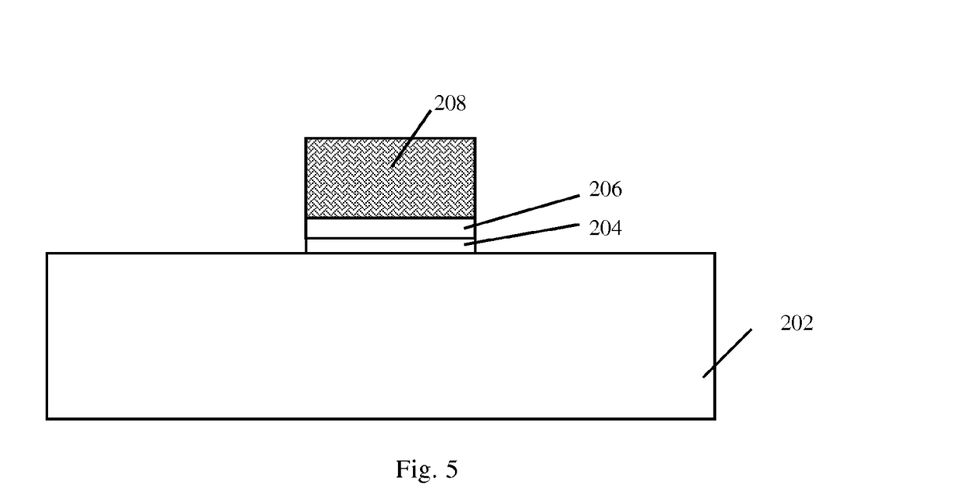

A gate stack structure patterning is carried out to the device to form the structure as illustrated in FIG. 5. The device may be patterned using a dry or wet etching technology. This is just exemplary and the present invention is not limited thereto.

Figure 6:
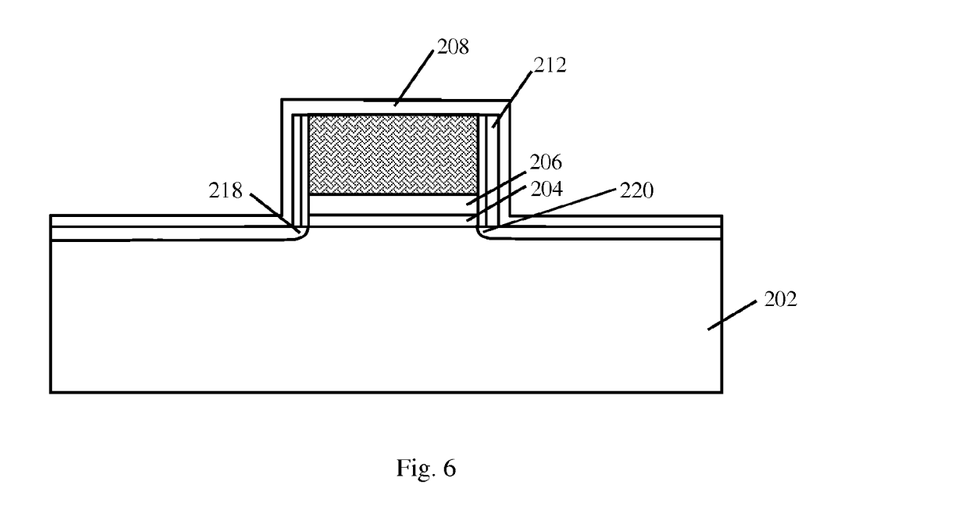

Optionally, sidewalls 212 may be formed after the gate stack is formed, as illustrated in FIG. 6. The sidewalls may be a single-layer structure, or a multi-layer structure. A material of the sidewalls may include nitride such as $Si_3N_4$ and SiON, oxide such as $SiO_2$ and $HfO_2$, or any combination thereof. The outermost sidewall may cover the entire substrate, or not cover the substrate at the S/D region.

Optionally, during the formation of the sidewalls, ion implantations may be carried out for a source extension region 218 and a drain extension region 220, and subsequently, processes such as ion activation and annealing are carried out.

Figure 7:
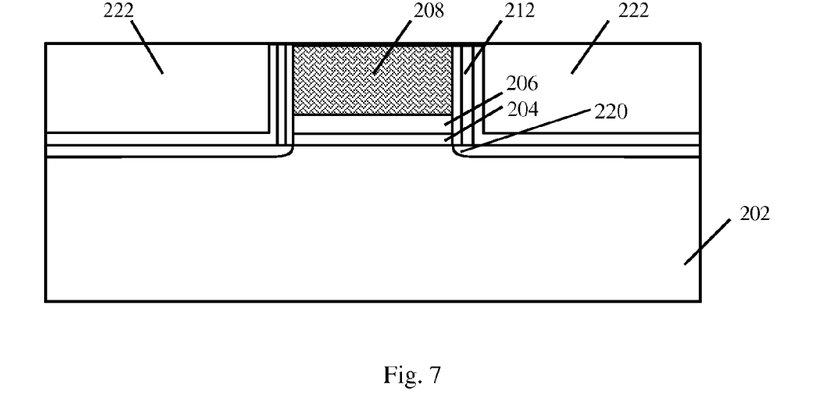

In step 103, an inter layer dielectric is formed by covering the device. As illustrated in FIG. 7, an inter layer dielectric (ILD) 222 is formed on the device. A material of the ILD includes $SiO_2$, $Si_3N_4$, $SiON_x$, etc. Next, a planarization is carried out by using a chemical mechanical polishing (CMP) technology.

Figure 8:
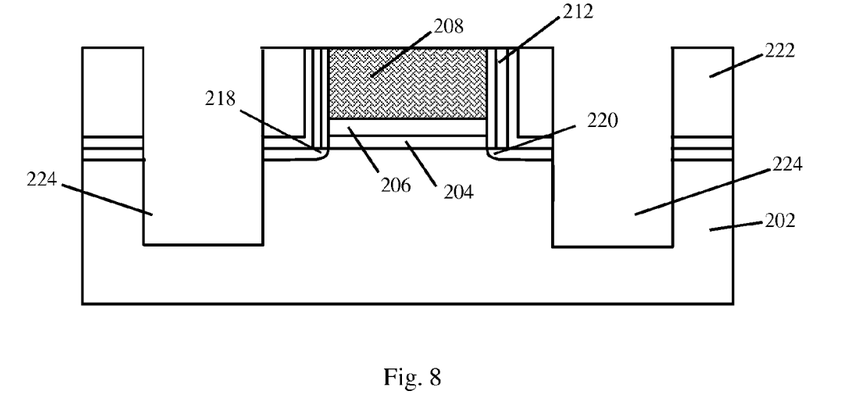
Figure 9:
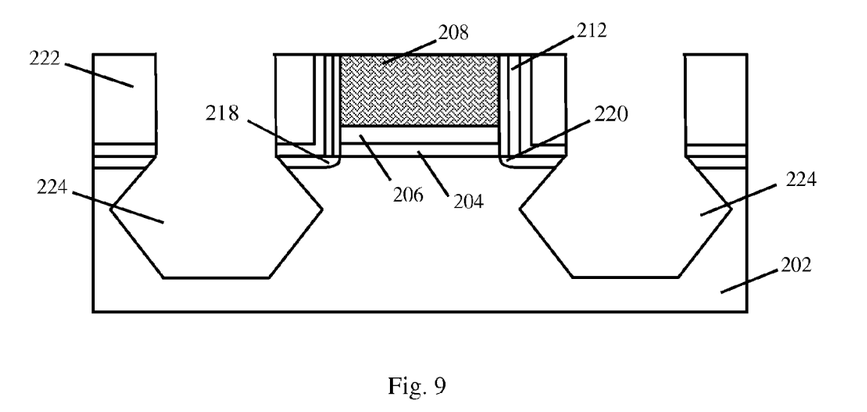

In step 104, the ILD at both sides of the gate stack and the substrate below the ILD are etched, so as to form a groove of the source region and the drain region respectively. As illustrated in FIG. 8, the S/D region and the ILD 222 thereon may be etched in a method that combines the dry and wet etching technologies, and the groove 224 of the source region and the drain region are formed respectively in the ILD and the substrate. In which, the ILD 222 and the substrate therebelow may be etched by using an isotropous dry etching technology to form a substantially square groove, as illustrated in FIG. 8; or the ILD 222 may be etched firstly by using the dry etching technology, and then the substrate therebelow is etched by using an anisotropic dry or wet etching technology to form a groove having an inverted Ω shape, as illustrated in FIG. 9.

Figure 10:
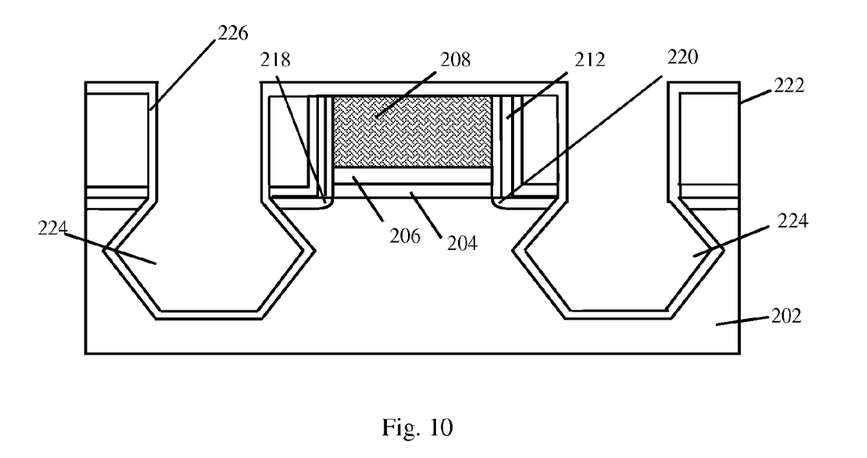

In step 105, a metal diffusion barrier layer is deposited in the groove. As illustrated in FIG. 10, a metal diffusion barrier layer 226 is deposited in the groove 224. A material of the metal diffusion barrier layer includes TiN, TaN, HfN, HfC, TaC, TiN/NiSi or any combination thereof. A thickness of the metal diffusion barrier layer is in a range from about 2 to about 20 nm. The metal diffusion barrier layer may be a single-layer structure, or a multi-layer film structure. The present invention is not limited to the above description.

In step 106, the groove is filled with metal to form source and drain regions. The groove 224 is filled with metal to form source and drain regions. The physical or chemical deposition method, such as ALD, metal organic CVD, sputtering, electron beam evaporation or the like may be adopted to execute step 106. The filling metal includes $TiAl_x$, Ta, Ti, Al, Co, Ru, Mo, W, Pd, Ir, Pt, Cu, $CuAg_x$ or any combination thereof.

Figure 11:
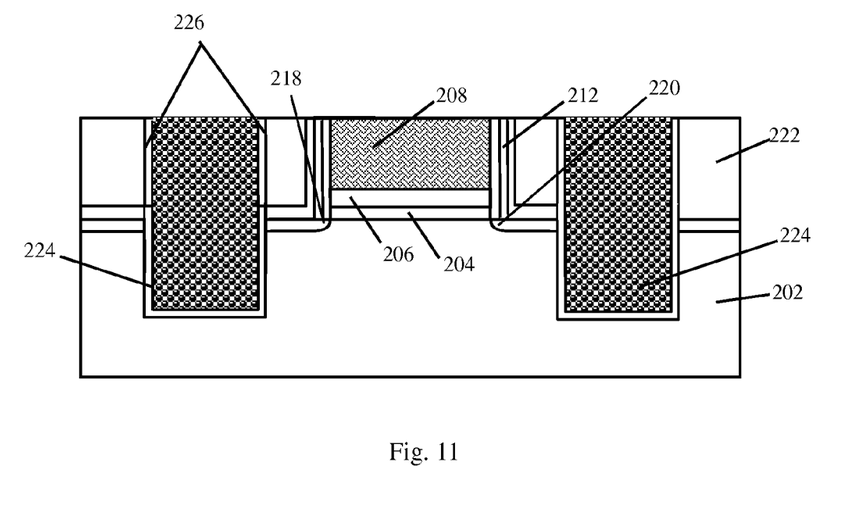
Figure 12:
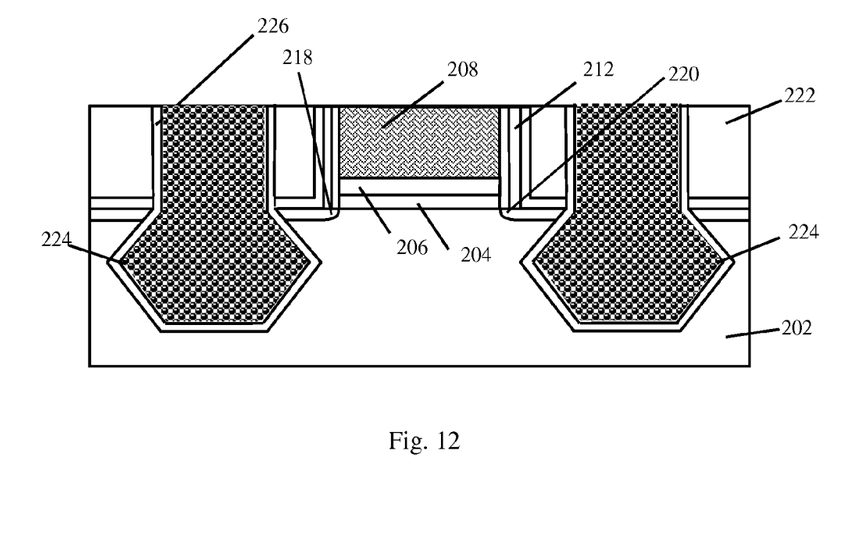

In addition, corresponding transverse tensile stress and compression stress may be generated for NMOS and PMOS devices by controlling the category and filling sequence of the filling metal. Finally, a CMP is carried out for the device structure filled with the metal, so as to form the gate structure, source region and drain region as illustrated in FIGS. 11-12.

Second Embodiment

Only the aspects of the second embodiment which are different from the first embodiment are described as follows.

The portions not described shall be deemed as adopting steps, methods or processes the same as those of the first embodiment, and herein are omitted.

Referring to FIG. 1, in step 101, a substrate 202 is firstly provided. The substrate may be a semiconductor substrate 202 having undergone an earlier stage shallow trench isolation treatment and a clarity process treatment, referring to FIG. 2. In this embodiment, the substrate 202 includes a silicon substrate in a crystal structure. As known in the art, the substrate may include various doping arrangements (e.g., P-type substrate or N-type substrate) according to design requirements. In other examples, the substrate may include semiconductors of other elements, such as germanium and diamond, or a compound semiconductor, such as SiC, GaAs, InAs or InP. Further, in order to improve performance, the substrate may optionally include an epitaxial layer, and/or a silicon-on-insulator (SOI) structure. Still further, the substrate may include various features formed thereon, including an active region, source and drain regions in the active region, an isolation region (e.g., shallow trench isolation (STI) feature), and/or other features known in the art.

Next in step 102, a gate stack is formed on the substrate 202. The gate stack may have different layers and there are different methods for forming it. In this embodiment, the gate stack may include an interface layer 204, a high k gate dielectric layer 206 and a metal gate electrode layer 208. In this embodiment, the gate stack has a structure different from that of the first embodiment. As illustrated in FIG. 2, the interface layer 204 may be directly formed on the substrate 202. The interface layer 204 may be made of $SiO_2$, SiON or $HfSiO_x$. The thickness of the interface layer 204 is in a range from about 0.3 nm to about 2 nm. The interface layer 204 may be formed through atomic layer deposition (ALD), chemical vapor deposition (CVD), high-density plasma CVD, sputtering or other appropriate methods. The above description is just exemplary, and the present invention is not limited thereto.

Next, the high k gate dielectric layer 206 is formed on the interface layer 204, as illustrated in FIG. 3. The high k gate dielectric layer 206 may be made of a material including a high k material (e.g., a material having a higher dielectric constant as compared with silicon oxide). The examples of the high k material include for example a hafnium-based material, such as $HfO_2$, $HfSiO_x$, $HfSiON_x$, $HfAlO_x$, $HfAlON_x$, $Al_2O_3$, $ZrO_2$, $ZrSiO_x$, $Ta_2O_5$, $La_2O_3$, $HfLaO_x$, $LaAlO_x$, $LaSiO_x$, $Y_2O_3$, $Gd_2O_3$ and $Sc_2O_3$, rare-earth metal oxide of any of the above materials, other rare-earth metal oxynitride, or any combination thereof. The high k gate dielectric layer may be formed through thermal oxidation, CVD or ALD. In this embodiment, the thickness of the high k gate dielectric layer 206 is in a range from about 1 nm to about 5 nm. The above description is just exemplary, and the present invention is not limited thereto.

Next, as illustrated in FIG. 4, after the high k gate dielectric layer 206 is formed, the metal gate electrode layer 208 may be deposited thereon. The metal gate electrode layer 208 may be a single-layer structure, or a multi-layer structure, with a thickness from about 5 nm to about 100 nm. A material of the metal gate electrode layer may include TaC, HfC, TiN, TaN, $MoN_x$, TiSiN, TiCN, TaAlC, TiAlN, MoAlN, $PtSi_x$, $Ni_3Si$, HfCN, TaTbN, TaErN, TaYbN, TaSiN, HfSiN, MoSiN, $RuTa_x$, $NiTa_x$, Hf $Ru_x$, $RuO_x$, Pt, Ru, Ir, Mo, Re, or any combination thereof. The structure of the metal gate electrode layer may further include a metal diffusion barrier layer.

Figure 13:
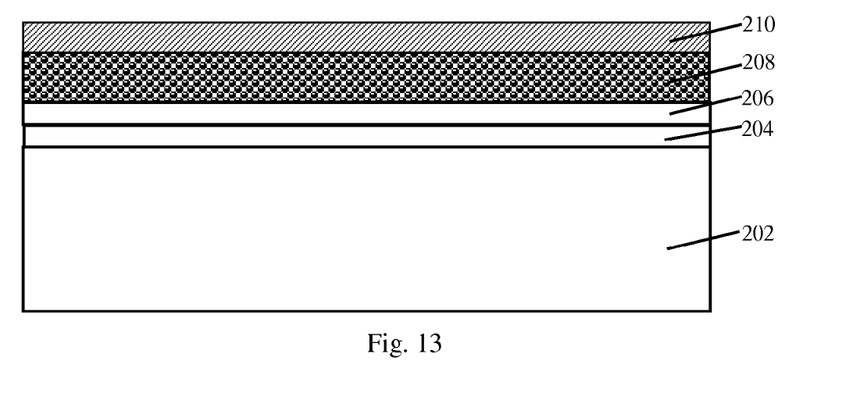
FIGS. 13-23 illustrate schematic cross-sectional diagrams at different phases of a semiconductor device according to another preferred embodiment of the present invention.

Next, polycrystalline silicon or an amorphous silicon cap layer is deposited on the metal gate electrode layer 208, so as to form a polycrystalline silicon layer 210 or an amorphous silicon cap layer as illustrated in FIG. 13. The polycrystalline silicon layer 210 may have a thickness in a range from about 10 nm to about 100 nm. The above description is just exemplary, and the present invention is not limited thereto.

Figure 14:
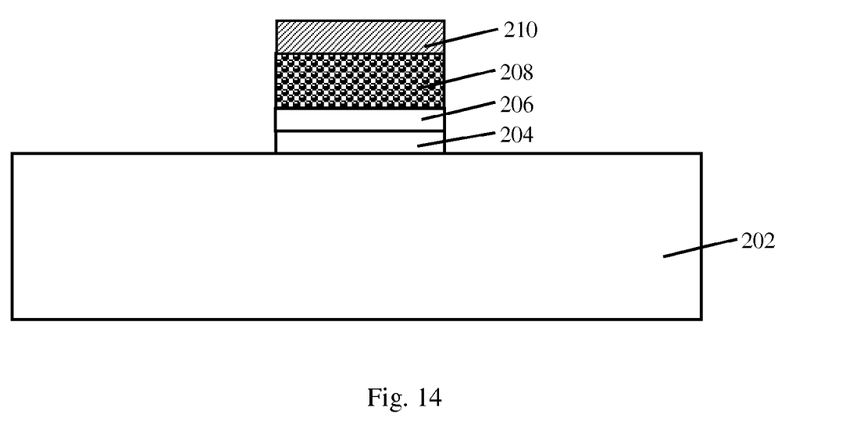

A gate stack structure patterning is carried out to the device to form the structure as illustrated in FIG. 14. The device may be patterned using a dry or wet etching technology. This is just exemplary and the present invention is not limited thereto.

Figure 15:
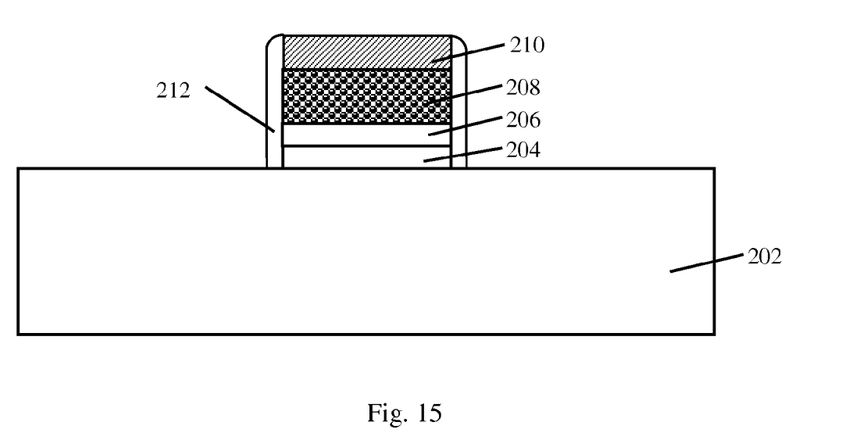

Optionally, sidewalls 212 may be formed after the gate stack is formed, as illustrated in FIG. 15. The sidewalls may be a single-layer structure, or a multi-layer structure. A material of the sidewalls may include nitride such as $Si_3N_4$ and SiON, oxide such as $SiO_2$ and $HfO_2$, or any combination thereof.

Optionally, during the formation of the sidewalls, ion implantations may be carried out for a source extension region and a drain extension region, and subsequently, processes such as ion activation and annealing are carried out.

Figure 16:
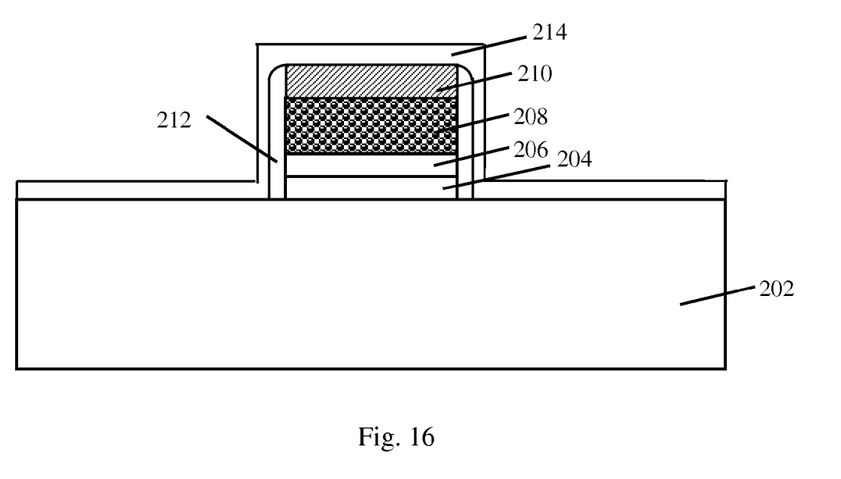
Figure 17:
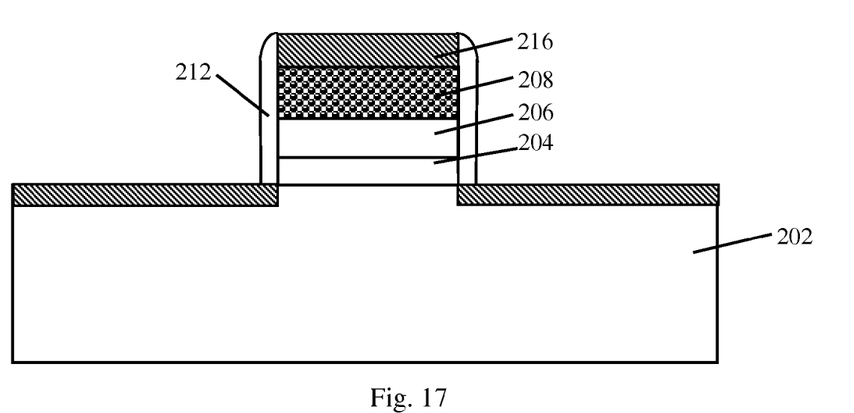

Next, a metal silicide is formed on the gate stack of the device and above the source and drain regions. For example, as illustrated in FIG. 16, a metal layer 214 may be formed on the structure as illustrated in FIG. 15. The metal layer may use a material such as Ni, Pt, W, Co, $NiPt_x$ alloy or the like with a thickness of about 5 nm to about 70 nm. After that, a thermal annealing is carried out for the structure as illustrated in FIG. 16, so as to form a self aligned metal compound layer 216 as illustrated in FIG. 17, such as to metal silicide layer, metal germanide layer, or other semiconductor metal compound layers. A temperature of the quick thermal annealing is in a range from 250° C. to 600° C.

In this step, the schottky barrier may be further controlled by way of an ion implantation or an impurity segregation technology after the thermal annealing. The method of impurity segregation is to sputter a layer of metal (e.g., yttrium, ytterbium, gadolinium, iridium, platinum or the like) on the S/D metal silicide. Then the metal is diffused into the metal silicide through the annealing, and segregated on an interface between the metal silicide and the semiconductor substrate, so as to decrease the schottky barriers of nMOS and pMOS. The method of ion implantation is to implant dopants, such as some atoms (e.g., boron, phosphor, arsenic, nitrogen and germanium) into the metal silicide by using the ion implantation technology. Then the dopant is activated through a low temperature annealing (e.g., lower than 500° C.), and segregated on an interface between the metal silicide and the semiconductor substrate, so that the schottky barrier is controlled.

Figure 18:
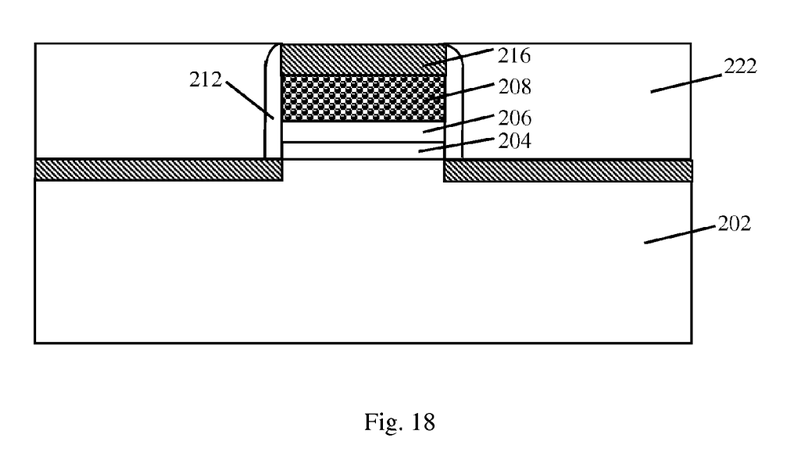

In step 103, an inter layer dielectric is formed by covering the device. As illustrated in FIG. 18, the inter layer dielectric (ILD) 222 is formed on the device. A material of the ILD includes $SiO_2$, $Si_3N_4$, $SiON_x$, etc. Next, a planarization is carried out by using a chemical mechanical polishing (CMP) technology.

Figure 19:
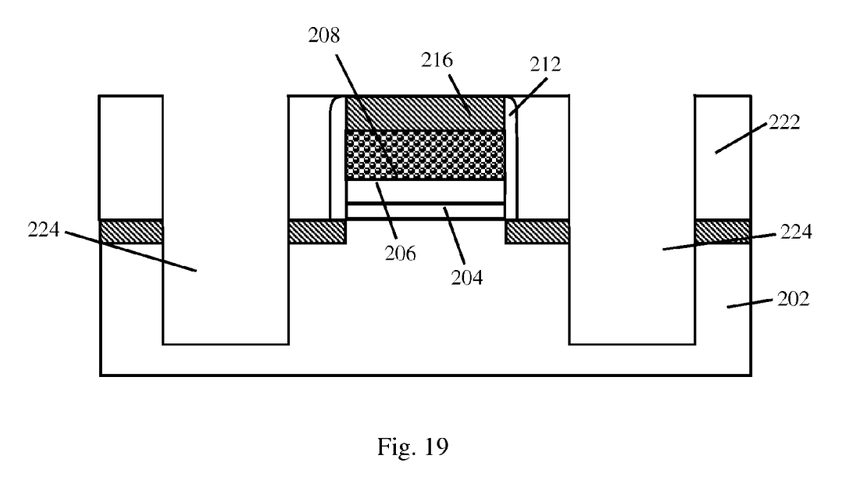
Figure 20:
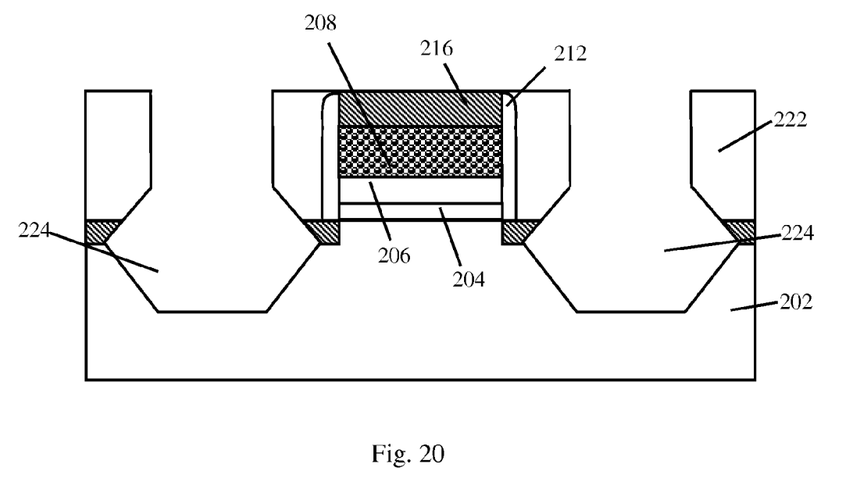

In step 104, the ILD at both sides of the gate stack and the substrate below the ILD are etched, so as to form a groove of the source region and the drain region respectively. As illustrated in FIG. 19, the S/D region and the ILD 222 thereon may be etched by a method that combines the dry and wet etching technologies, and the groove 224 of the source region and the drain region are formed respectively in the ILD and the substrate. In which, the ILD 222 and the substrate therebelow may be etched by using an isotropous dry etching technology to form a substantially square groove, as illustrated in FIG. 19; or the ILD 222 may be etched firstly by using the dry etching technology, and then the substrate therebelow is etched by using an anisotropic dry or wet etching technology to form a groove having an inverted 0 shape, as illustrated in FIG. 20.

Figure 21:
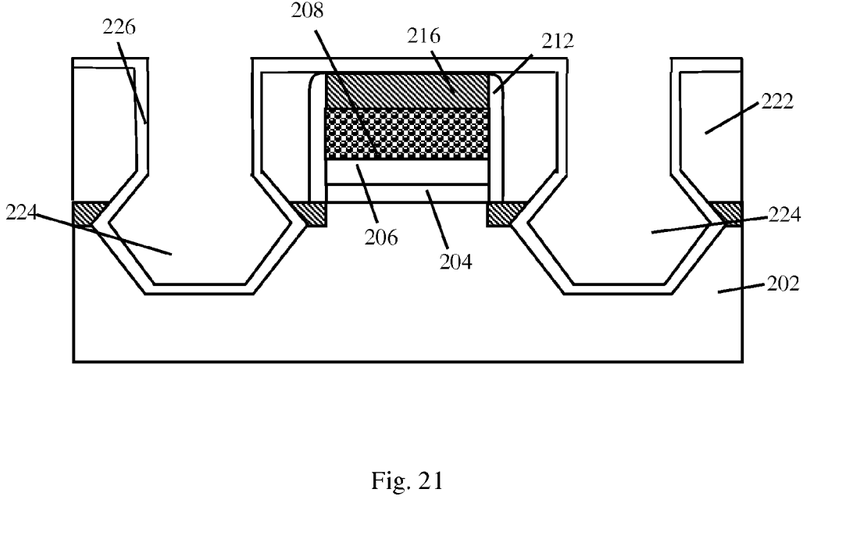

In step 105, a metal diffusion barrier layer is deposited in the groove. As illustrated in FIG. 21, a metal diffusion barrier layer 226 is deposited in the groove 224. A material of the metal diffusion barrier layer includes TiN, TaN, HfN, HfC, TaC or any combination thereof. A thickness of the metal diffusion barrier layer is in a range from about 2 to about 20 nm. The metal diffusion barrier layer may be a single-layer structure, or a multi-layer membrane structure. The present invention is not limited to the above description.

Figure 22:
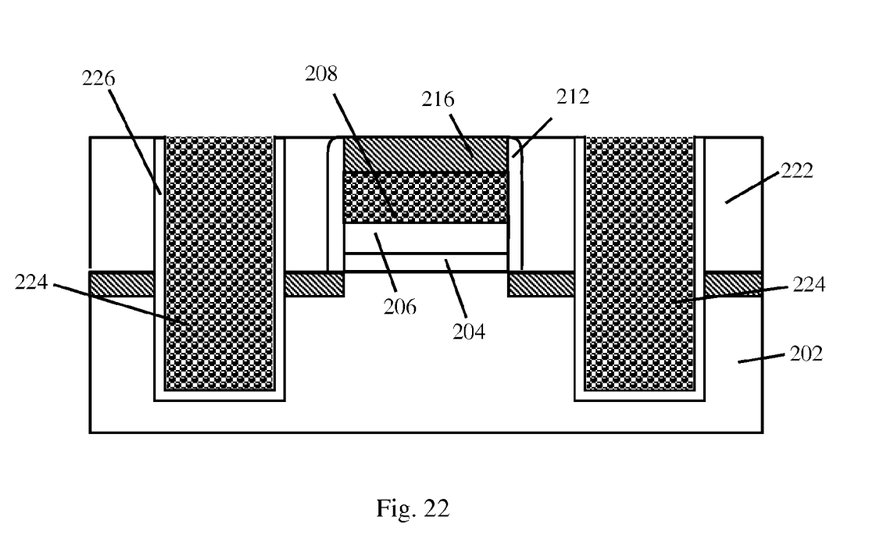
Figure 23:
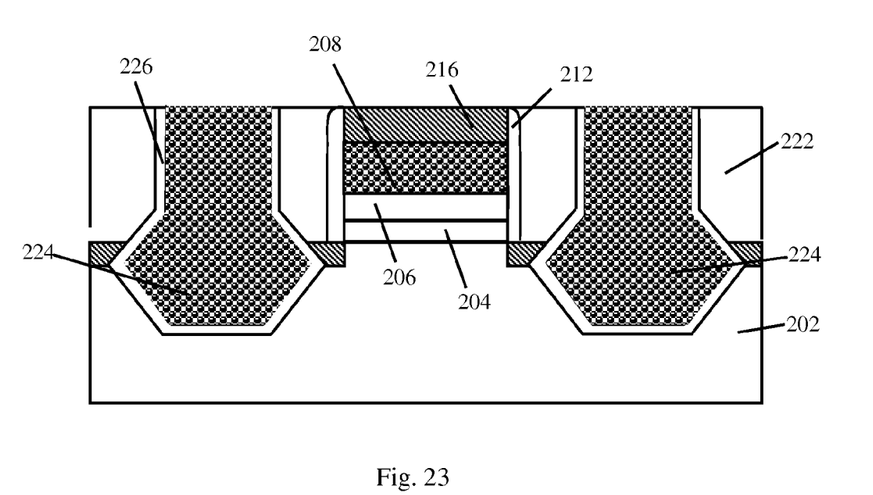

In step 106, the groove is filled with metal to form source and drain regions. As illustrated in FIG. 22, the groove 224 is filled with metal to form source and drain regions. The physical or chemical deposition method, such as ALD, metal organic CVD, sputtering, electron beam evaporation or the like, may be adopted to execute step 106. The filling metal includes $TiAl_x$, Ta, Ti, Al, Co, Ru, Mo, W, Pd, Ir, Pt, Cu, $CuAg_x$ or any combination thereof. In addition, corresponding transverse tensile stress and compression stress may be generated for NMOS and PMOS devices by controlling the category and filling sequence of the filling metal. Finally, a CMP is carried out for the device structure filled with the metal, so as to form the gate structure, source region and drain region as illustrated in FIGS. 22-23.

In the above processes, the semiconductor region under the sidewalls which is not implanted with ions can be metalized through a metal diffusion occurring during the formation of the low schottky barrier metal layer, and a metal diffusion amount and a diffusion length can be controlled through a process parameter optimization. After the low schottky barrier metal S/D extension region is formed, the embedded metal S/D is formed through an etching process and a metal filling process.

In the present invention, the source and drain regions on the semiconductor substrate are etched and metal filled to implement replacement of the conventional PN junction S/D with the embedded metal S/D. Through the present invention, a fully metalized S/D and S/D extension region may be implemented, which not only reduces the S/D parasitic resistance and increases the carrier mobility induced by the stress in the channel region, but also avoids high temperature processes during the formation of the PN junction S/D and the PN junction S/D extension region, thus the entire performance of the MOS device is improved.

Although the exemplary embodiments and the advantages have been detailedly described herein, it shall be appreciated that various changes, substitutions and modifications may be made to these embodiments without deviating from the spirit of the present invention and the protection scopes defined by the accompanied claims. With respect to other examples, it will be easily understood by a person skilled in the art that the sequence of the processing steps may be changed while maintaining the protection scope of the present invention.

Furthermore, the application scope of the present invention is not limited to the processes, structures, manufacturing, compositions, means, methods and steps of the specific embodiments as described in the specification. According to the disclosure of the present invention, a person skilled in the art will easily appreciate that when the processes, structures, manufacturing, compositions, means, methods and steps currently existing or to be developed in future are adopted to perform functions substantially the same as corresponding embodiments described in the present invention, or achieve substantially the same effects, a person skilled in the art can make applications of them according to the present invention. Therefore, the accompanied claims of the present invention intend to include these processes, structures, manufacturing, compositions, means, methods and steps within their protection scopes.

What is claimed is:

1. A method for manufacturing a semiconductor device, comprising:
   101. providing a substrate;
   102. forming a gate stack on the substrate, then forming a metal silicide on the gate stack and the substrate, and controlling a schottky barrier after forming the metal silicide;
   103. forming an inter layer dielectric (ILD) to cover the device;
   104. etching the ILD at both sides of the gate stack and the substrate below the ILD, so as to form a groove of source and drain regions respectively;
   105. depositing a metal diffusion barrier layer in the groove; and
   106. filling the groove with a metal to form the source and drain regions;
   wherein step 102 further comprises:
      forming an interface layer on the substrate;
      depositing a high k gate dielectric layer on the interface layer;
      depositing a metal gate electrode layer on the high k gate dielectric layer; and
      depositing one of a polycrystalline silicon layer and an amorphous silicon cap layer on the metal gate electrode layer;
   wherein the method further comprises, after step 102:
      forming a metal silicide on the gate stack and the substrate; and
      controlling a schottky barrier after forming the metal silicide;
   wherein the step of controlling the schottky barrier comprises:
      sputtering a layer of metal on the metal silicide on the substrate;
      diffusing the metal into the metal silicide through annealing, and separating the metal on an interface between the metal silicide and the semiconductor substrate, so as to decrease the schottky barrier.

2. A method for manufacturing a semiconductor device, comprising:
   101. providing a substrate;
   102. forming a gate stack on the substrate, then forming a metal silicide on the gate stack and the substrate, and controlling a schottky barrier after forming the metal silicide;
   103. forming an inter layer dielectric (ILD) to cover the device;
   104. etching the ILD at both sides of the gate stack and the substrate below the ILD, so as to form a groove of source and drain regions respectively;
   105. depositing a metal diffusion barrier layer in the groove; and
   106. filling the groove with a metal to form the source and drain regions;
   wherein step 102 further comprises:
      forming an interface layer on the substrate;
      depositing a high k gate dielectric layer on the interface layer;
      depositing a metal gate electrode layer on the high k gate dielectric layer; and
      depositing one of a polycrystalline silicon layer and an amorphous silicon cap layer on the metal gate electrode layer;

wherein the method further comprises, after step 102:
   forming a metal silicide on the gate stack and the substrate; and
   controlling a schottky barrier after forming the metal silicide;
wherein the step of controlling the schottky barrier comprises:
   implanting a dopant for the metal silicide on the substrate by performing an ion implantation;
   performing low temperature annealing to activate the dopant so as to segregate the dopant on an interface between the metal silicide and the semiconductor substrate.

3. The method according to claim 1 or 2, wherein a portion of the groove in the substrate has a substantially inverted Ω shape or a substantially square shape.

4. The method according to claim 1 or 2, wherein a thickness of the metal diffusion barrier layer is in a range from 2 to 20 nm.

5. The method according to claim 1 or 2, wherein the metal diffusion barrier layer is formed by selecting one from a group including TiN, TaN, HfN, HfC, TaC, TiN/NiSi and any combination thereof; and the barrier layer may be single-layered or multi-layered.

6. The method according to claim 1 or 2, wherein the metal in step 106 is selected from a group including TiAlx, Ta, Ti, Al, Co, Ru, Mo, W, Pd, Ir, Pt, Cu, CuAgx and any combination thereof.

* * * * *